(12) United States Patent
Min et al.

(10) Patent No.: US 8,002,019 B2
(45) Date of Patent: Aug. 23, 2011

(54) HEAT DISSIPATION DEVICE

(75) Inventors: Xu-Xin Min, Shenzhen (CN); Meng Fu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 792 days.

(21) Appl. No.: 12/051,853

(22) Filed: Mar. 20, 2008

(65) Prior Publication Data
US 2009/0236076 A1 Sep. 24, 2009

(51) Int. Cl.
*H05K 7/20* (2006.01)
(52) U.S. Cl. .................. 165/80.3; 165/104.33; 361/700
(58) Field of Classification Search ............... 165/80.3, 165/104.33; 361/700
See application file for complete search history.

(56) References Cited

U.S. PATENT DOCUMENTS

| | | | |
|---|---|---|---|
| 7,269,014 B1 * | 9/2007 | Zhao et al. ............ | 361/700 |
| 7,296,617 B2 * | 11/2007 | Lee et al. ............. | 165/80.3 |
| D579,423 S * | 10/2008 | Chang et al. .......... | D13/179 |
| 7,443,677 B1 * | 10/2008 | Zhou et al. ........... | 361/702 |
| 7,870,890 B2 * | 1/2011 | Liu .................... | 165/104.33 |
| 2003/0019610 A1 * | 1/2003 | Liu .................... | 165/80.3 |
| 2005/0141198 A1 * | 6/2005 | Lee et al. ............. | 361/700 |
| 2006/0054307 A1 * | 3/2006 | Lee et al. ............. | 165/80.3 |
| 2007/0000646 A1 | 1/2007 | Chen et al. | |
| 2007/0051501 A1 * | 3/2007 | Wu et al. ............. | 165/104.33 |
| 2007/0055342 A1 | 3/2007 | Wu et al. | |
| 2008/0115914 A1 * | 5/2008 | Yang et al. ........... | 165/104.33 |
| 2008/0236798 A1 * | 10/2008 | Zheng et al. .......... | 165/104.33 |

FOREIGN PATENT DOCUMENTS

| CN | 1925735 A | 3/2007 |
|---|---|---|
| TW | 200702620 A | 1/2007 |

* cited by examiner

*Primary Examiner* — Allen J Flanigan
(74) *Attorney, Agent, or Firm* — Frank R. Niranjan

(57) ABSTRACT

A heat dissipation device includes a base, a fin group located on the base, a first heat pipe and a second heat pipe. The fin group includes a first fin group, a second fin group arranged on the first fin group and a third fin group arranged on the second fin group. The first heat pipe includes an evaporating portion sandwiched between the base and the first fin group, a condensing portion sandwiched between the first fin group and the second fin group, and a connecting portion interconnecting the evaporating portion and the condensing portion. The second heat pipe includes an evaporating portion sandwiched between the base and the first fin group, a condensing portion located between the second fin group and the third fin group, and a connecting portion interconnecting the evaporating portion and the condensing portion thereof.

17 Claims, 4 Drawing Sheets

HEAT DISSIPATION DEVICE

BACKGROUND OF THE INVENTION

1. Field of the Invention

The present invention relates to a heat dissipation device adapted for removing heat from electronic devices, and more particularly to a heat dissipation device incorporating heat pipes for improving heat dissipation efficiency of the heat dissipation device.

2. Related Art

During operation of an electronic device such as computer central processing units (CPUs), a large amount of heat is often generated. The heat must be quickly removed from the CPU to prevent it from becoming unstable or being damaged. Typically, a heat dissipation device is attached to an outer surface of the CPU to absorb heat from the CPU. The heat absorbed by the heat dissipation device is then dissipated to ambient air.

Conventionally, a heat dissipation device may includes a fin-type heat sink. A conventional heat sink is made of highly heat-conductive metal, such as copper or aluminum, and generally includes a base portion for contacting the electronic device to absorb heat therefrom and a plurality of fins formed on the base portion for dissipating heat. However, as the operation speed of electronic devices has been continually upgraded, these kinds of conventional heat sinks can no longer meet the heat dissipation requirements of modern IC packages. Nowadays, heat pipes have been widely used due to their great heat-transferring capability. Accordingly, heat sinks are equipped with heat pipes with various arrangements.

A typical heat dissipation device incorporating a plurality of heat pipes includes a fin-typed heat sink. The heat sink includes a base for contacting an electronic device and a plurality of fins arranged on the base. The fins are combined together with the base by soldering or other means. The base defines a plurality of grooves therein. The fins cooperatively define a plurality of through holes therein. Each heat pipe has a substantially straight evaporating portion received in a corresponding groove of the base, and a straight condensing portion received in a corresponding through hole of the fins. The heat generated by the electronic device is absorbed by the base, and transferred from the base to the fins via the heat pipes, and finally dissipated from the fins to ambient air. However, a contact surface of the heat pipes and the fins of the above mentioned heat dissipation device is limited, and the heat can not be transferred evenly to the fins, which accordingly decreases a heat dissipation efficiency of the heat dissipation device.

What is needed, therefore, is an improved heat dissipation device which can overcome the above problems.

SUMMARY OF THE INVENTION

A heat dissipation device includes a base adapted for absorbing heat from an electronic device, a fin group located on the base, a first heat pipe and a second heat pipe interconnecting the base and the fin group. The fin group includes a first fin group, a second fin group arranged on the first fin group and a third fin group arranged on the second fin group. The first heat pipe includes an evaporating portion sandwiched between the base and the first fin group, a condensing portion sandwiched between the first fin group and the second fin group, and a connecting portion interconnecting the evaporating portion and the condensing portion thereof. The second heat pipe includes an evaporating portion sandwiched between the base and the first fin group, a condensing portion located between the second fin group and the third fin group, and a connecting portion interconnecting the evaporating portion and the condensing portion of the second heat pipe. The condensing portion of each of the first and second heat pipes has a U-shaped configuration.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
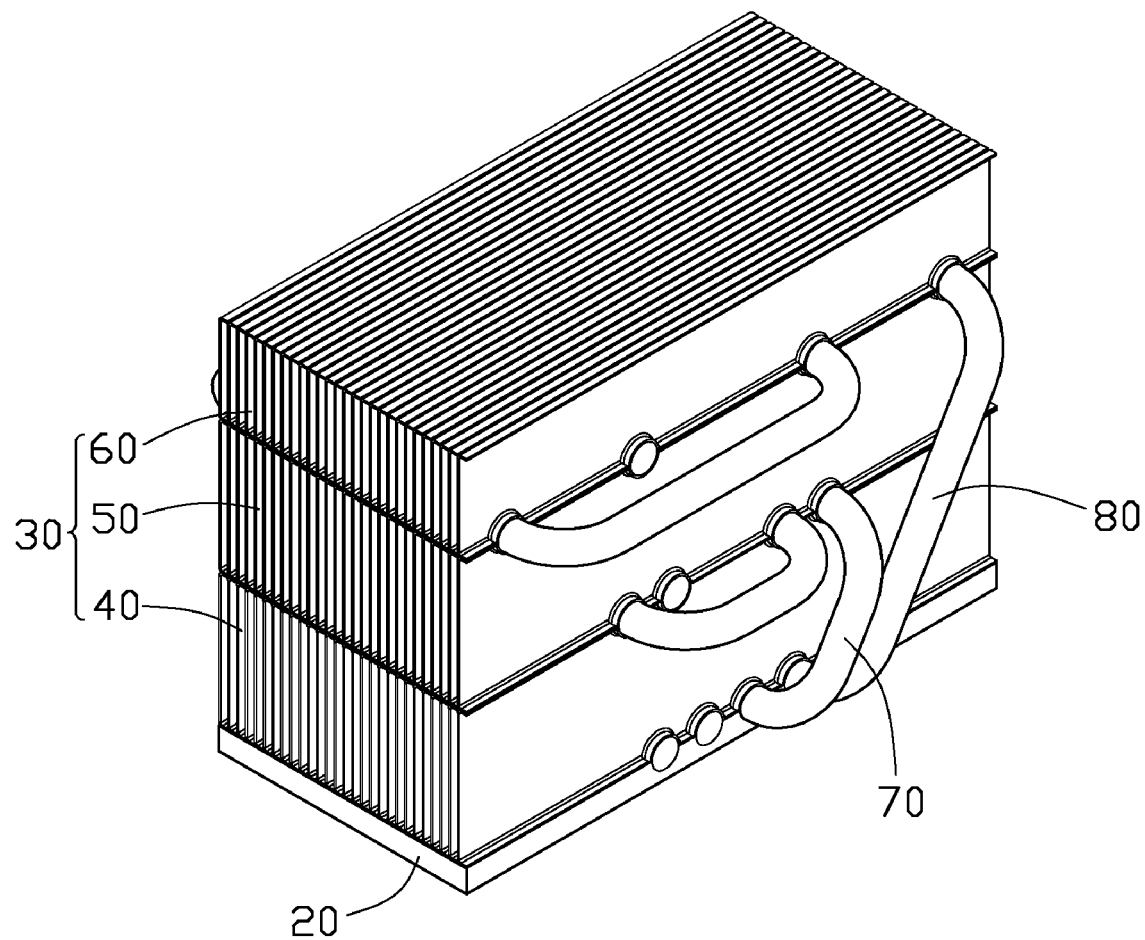
FIG. 1 is an assembled, isometric view of a heat dissipation device in accordance with a preferred embodiment of the present invention.
Figure 2:
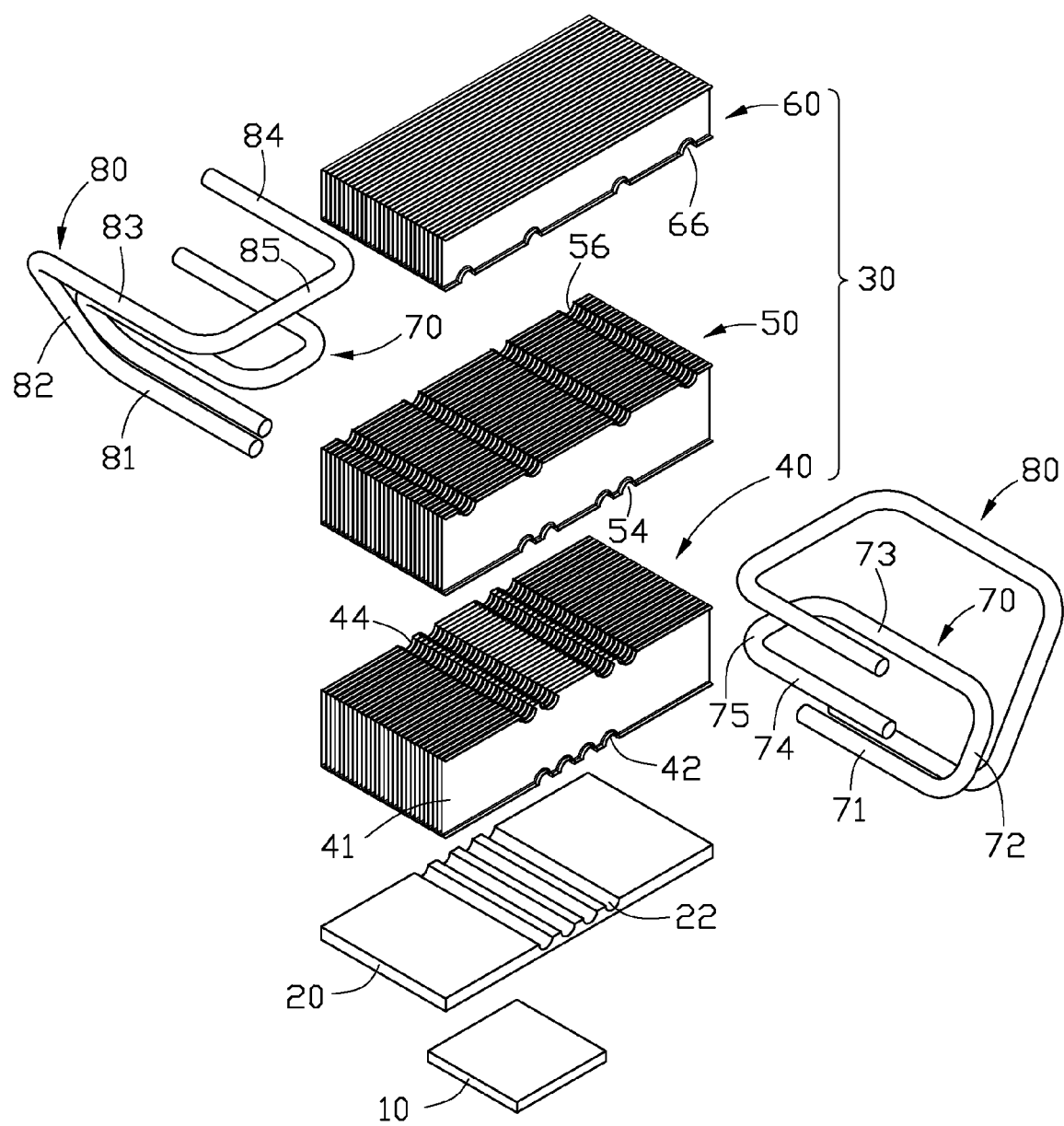
FIG. 2 is an exploded, isometric view of the heat dissipation device in FIG. 1.

Referring to FIGS. 1-2, a heat dissipation device in accordance with a preferred embodiment of the present invention is mounted on a printed circuit board (not shown) to remove heat from a heat-generating electronic device 10 such as a CPU mounted on the printed circuit board. The heat dissipation device comprises a base 20, a fin group 30 arranged on the base 20, a pair of first heat pipes 70 and a pair of second heat pipes 80 thermally connecting the base 20 and the fin group 30.

The base 20 is made of a material having high heat conductivity, such as copper or aluminum. The base 20 is a rectangular flat plate. A bottom surface of the base 20 contacts with the heat-generating electronic device 10 to absorb heat generated from the heat-generating electronic device 10. The heat-generating electronic device 10 is substantially positioned at a middle portion of the bottom surface of the base 20. Four semi-cylindrical grooves 22 are defined at a top surface of the base 20 for receiving parts of the pairs of first and second heat pipes 70, 80. The grooves 22 are parallel to each other and parallel to two short sides of the base 20. The grooves 22 are closely spaced from each other and positioned at a substantially middle portion of the base 20.

The fin group 30 comprises a first fin group 40 arranged on the base 20, a second fin group 50 arranged on the first fin group 40, and a third fin group 60 arranged on the second fin group 50. The first fin group 40 comprises a plurality of fins 41 parallel to each other. The fins 41 have a length the same as that of the base 20.

Each fin 41 includes a vertically-oriented, rectangular-shaped main body (not labeled) and two flanges (not labeled) horizontally extending from bottom and top ends of the main body, respectively. The flanges of a front fin 41 abut against the main body of a rear fin 41 so as to form an air passage (not labeled) between the two adjacent fins 41, and the fins 41 of the first fin group 40 are combined together by soldering or other means such as by engaging structures formed between adjacent fins 41. For example, such engaging structures may include, without limitation, holes formed in one fin 41 and engaging hooks formed on an adjacent fin 41 to engage in the holes of the one fin 41. Corresponding to the four grooves 22 on the base 20, four semi-cylindrical grooves 42 are defined at a bottom surface of the first fin group 40. Four semi-cylindrical grooves 44 are defined at a top surface of the first fin group 40. The four grooves 44 are parallel to each other and parallel to the grooves 42. Two inner ones of the grooves 44 are located respectively over and in line with two outer ones of the grooves 42. Another two grooves 44 are located at two flanks of the two inner grooves 44. The four grooves 44 can be divided into two pairs. A distance between the pairs is larger than that between the grooves 44 of each pair.

The second fin group 50 and the third fin group 60 each have a similar configuration with the first fin group 40 except the arrangement of grooves 54, 56, 66 thereof. Thus, a detailed description of the second and third fin groups 50, 60 is omitted. Corresponding to the four grooves 44 on the top surface of the first fin group 40, four semi-cylindrical grooves 54 are defined at a bottom surface of the second fin group 50. Four semi-cylindrical grooves 56 are defined at a top surface of the second fin group 50. The grooves 56 are parallel to each other and parallel to the grooves 54. The grooves 56 are equidistantly distributed on the top surface of the second fin group 50. Corresponding to the four grooves 56 on the top surface of the second fin group 50, four semi-cylindrical grooves 66 are defined at a bottom surface of the third fin group 60.

The pair of first heat pipes 70 has essentially identical configurations, as well as having essentially identical functions. Each of the first heat pipes 70 has a horizontal, straight evaporating portion 71. A first connecting portion 72 upwardly and slantwise extends from one end of the evaporating portion 71. A first condensing portion 73 horizontally extends from a free end of the first connecting portion 72. The first condensing portion 73 is parallel to the evaporating portion 71. The first condensing portion 73, the first connecting portion 72 and the evaporating portion 71 cooperatively form a U-shaped configuration, which has an opening oriented towards a first direction. An included angle is defined between the first connecting portion 72 and a horizontal plane on which the evaporating portion 71 extends. A perpendicular distance between the evaporating portion 71 and the first condensing portion 73 is substantially identical to a height of the first fin group 40. A second connecting portion 75 horizontally extends from a free end of the first condensing portion 73. A second condensing portion 74 horizontally extends from a free end of the second connecting portion 75 and towards the first connecting portion 72. The first condensing portion 73, the second connecting portion 75 and the second condensing portion 74 are parallel to the horizontal plane and cooperatively form another U-shaped configuration, which has an opening oriented towards a second direction opposite to the first direction. A length of each of the evaporating portion 71, the first and second condensing portion 73, 74 is substantially identical to a length of each of the grooves 22, 42, 44.

The pair of second heat pipes 80 each has a configuration similar to that of the first heat pipe 70. Each of the second heat pipes 80 also includes an evaporating portion 81, first and second condensing portions 83, 84 and first and second connecting portions 82, 85 respectively interconnecting the evaporating portion 81 and the first condensing portion 83, and the first condensing portion 83 and the second condensing portion 84. Differences between the second heat pipes 80 and the first heat pipes 70 are that a length of the first and second connecting portions 82, 85 of the second heat pipes 80 is larger than that of the first and second connecting portions 72, 75 of the first heat pipes 70. Thus, a distance between the evaporating portion 81 and the first condensing portion 83 of the second heat pipes 80 is larger than that between the evaporating portion 71 and the first condensing portion 73 of the first heat pipe 70, and a distance between the first and second condensing portions 83, 84 of the second heat pipes 80 is larger than that between the first and second condensing portions 73, 74 of the first heat pipes 70. A perpendicular height between the evaporating portion 81 and the first condensing portion 83 of the second heat pipes 80 is substantially identical to a total height of the first and second fin groups 40, 50.

Figure 3:
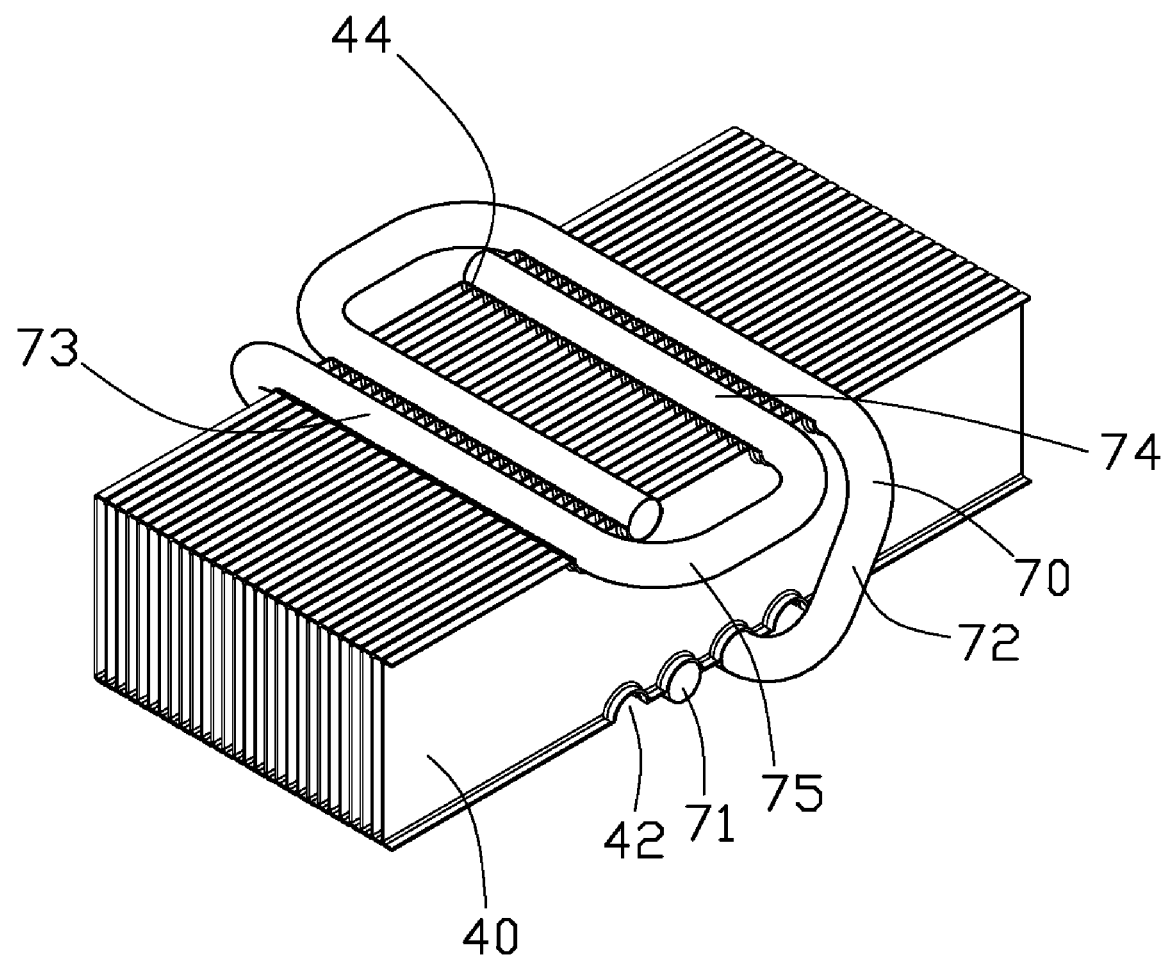
FIG. 3 is a partially assembled, isometric view of the heat dissipation device in FIG. 1.
Figure 4:
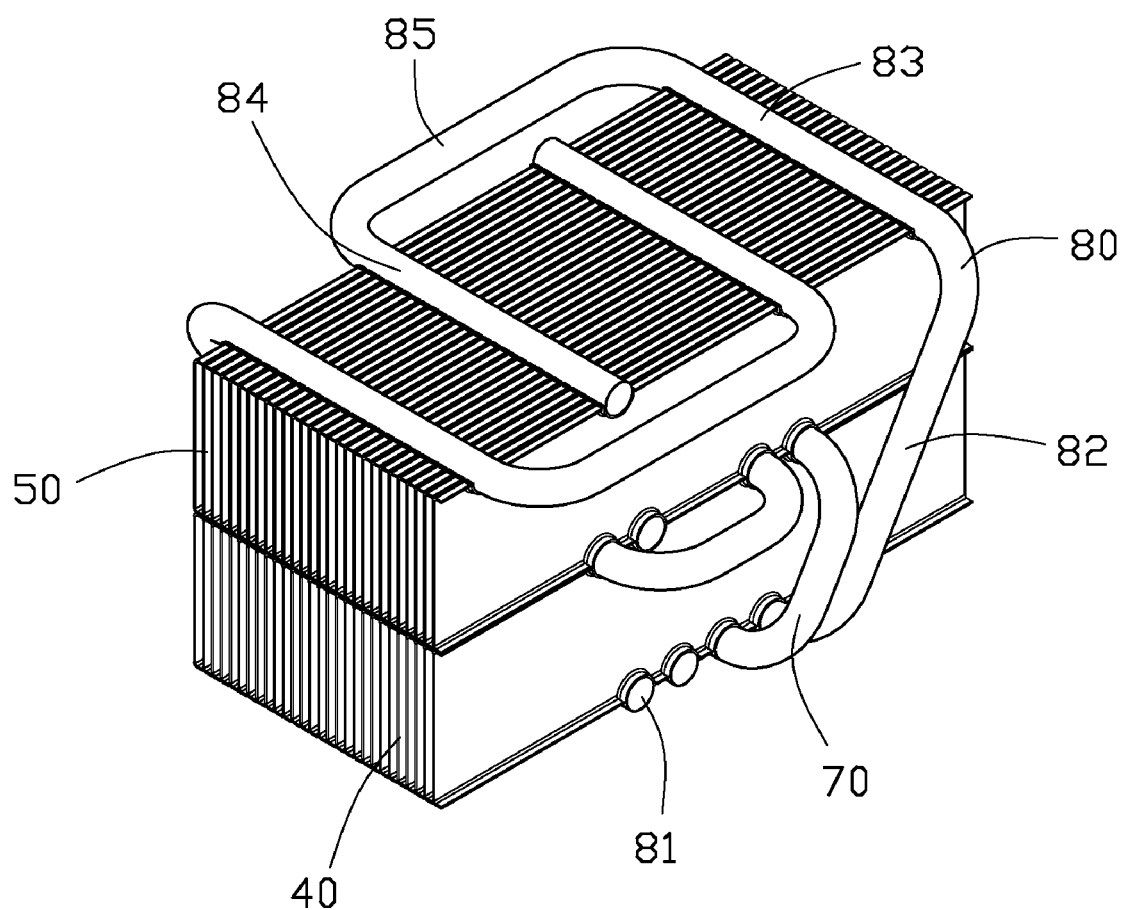
FIG. 4 is another partially assembled, isometric view of the heat dissipation device in FIG. 1.

Please also referring to FIGS. 3-4, in assembly, firstly, the pair of first heat pipes 70 is brought to enclose the first fin group 40 from front and rear sides of the first fin group 40. The evaporating portions 71 are received in the two inner ones of the grooves 42. The first and second condensing portions 73, 74 are received in the grooves 44. The first connecting portions 72 of the first heat pipes 70 are symmetrically and oppositely located at the front and rear sides of the first fin group 40. The second connecting portions 75 of the first heat pipes 70 are symmetrically and oppositely located at the front and rear sides of the top of first fin group 40. The second condensing portion 74 of one of the first heat pipes 70 is inserted into the opening of U-shaped configuration formed by the first and second condensing portions 73, 74 and the second connecting portion 75 of another first heat pipe 70. In another word, the second condensing portion 74 of one of the first heat pipes 70 is located between the first and second condensing portions 73, 74 of the other first heat pipe 70; the second condensing portion 74 of the other first heat pipe 70 is located between the first and second condensing portions 73, 74 of the one of the first heat pipes 70.

Then, the second fin group 50 is arranged on the first fin group 40. The grooves 54 of the second fin group 50 and the grooves 44 cooperatively receive the first and second condensing portions 73, 74 of the pair of first heat pipes 70 therein. Thus, the first and second condensing portions 73, 74 of the first heat pipes 70 are sandwiched between the first and second fin groups 40, 50.

Thereafter, the pair of second heat pipes 80 is brought to enclose the first and second fin groups 40, 50 from front and rear sides of the first and second fin groups 40, 50. The evaporating portions 81 of the second heat pipes 80 are received in the two outer ones of the grooves 42 and located at two flanks of the evaporating portions 71 of the first heat pipes 70. The first and second condensing portions 83, 84 are received in the grooves 56 of the second fin group 50. The first connecting portions 82 of the second heat pipes 80 are symmetrically and oppositely located at the front and rear sides of the first and second fin groups 40, 50. The second connecting portions 85 of the second heat pipes 80 are symmetrically and oppositely located at the front and rear sides of the top of the second fin group 50. The second condensing portion 84 of one of the second heat pipes 80 is located between the first and second condensing portions 83, 84 of the other second heat pipe 80. The second condensing portion 84 of the other second heat pipe 80 is located between the first and second condensing portions 83, 84 of the one of the second heat pipes 80.

Finally, the third fin group 60 is arranged on the second fin group 50, and the fin group 30 (consisting of the first, second and third fin groups 40, 50, 60) and the two pairs of the heat pipes 70, 80 are together arranged on the base 20. In this way the assembly of the heat dissipation device is completed. The first and second condensing portions 83, 84 of the second heat pipes 80 are sandwiched between the second and third fin groups 50, 60. The evaporating portions 71 of the first heat pipes 70 and the evaporating portions 81 of the second heat pipes 80 are sandwiched between the base 20 and the first fin group 40.

In operation, heat produced by the heat-generating electronic device 10 is firstly absorbed by the base 20. A part of the heat absorbed by the base 20 is directly conducted to the first fin group 40, and then dissipated to atmosphere. Another part of the heat absorbed by the base 20 is evenly conducted to the second and third fin groups 50, 60 via the first and second heat pipes 70, 80, and at last dissipated to atmosphere. Compared with conventional heat dissipation devices, a contact surface of the first and second heat pipes 70, 80 and the fin group 30 of the present heat dissipation device is much larger, and the heat can be distributed into the fin group 30 more evenly. Thus, a heat dissipation efficiency of the heat dissipation device is increased.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device for removing heat from a heat generating electronic device, the heat dissipation device comprising:
    a base adapted for absorbing heat from the heat generating electronic device;
    a fin group located on the base, the fin group comprising a first fin group and a second fin group arranged on the first fin group;
    at least a first heat pipe comprising an evaporating portion sandwiched between the base and the first fin group, a condensing portion sandwiched between the first fin group and the second fin group, and a connecting portion interconnecting the evaporating portion and the condensing portion; and
    at least a second heat pipe comprising an evaporating portion sandwiched between the base and the first fin group, a condensing portion located on the second fin group, and a connecting portion interconnecting the evaporating portion and the condensing portion thereof;
    wherein the condensing portion of each of the at least a first and second heat pipes has a U-shaped configuration; and
    wherein a plurality of grooves is defined on a top of the base and on a bottom of the first fin group for receiving the evaporating portions of the at least a first and second heat pipes, a plurality of grooves is defined on a top of the first fin group and on a bottom of the second fin group for receiving the condensing portion of the at least a first heat pipe, and a plurality of grooves is defined on a top of the second fin group for receiving the condensing portion of the at least a second heat pipe.

2. The heat dissipation device as claimed in claim 1, wherein the evaporating portions of the at least a first and second heat pipes are parallel to each other and located at a middle position of the base.

3. The heat dissipation device as claimed in claim 1, wherein the connecting portion of the at least a first heat pipe is located at one side of the fin group, and the connecting portion of the at least a second heat pipe is located at another side of the fin group opposite to the one side of the fin group.

4. The heat dissipation device as claimed in claim 1, wherein the connecting portion of the at least a first heat pipe and the connecting portion of the at least a second heat pipe are located at a same side of the fin group.

5. The heat dissipation device as claimed in claim 1, wherein the fin group further comprises a third fin group, the third fin group being located on the second fin group, and the condensing portion of the at least a second heat pipe being sandwiched between the second fin group and the third fin group.

6. The heat dissipation device as claimed in claim 1, comprising a pair of first heat pipes and a pair of second heat pipes, the evaporating portions of the first heat pipes located between the evaporating portions of the second heat pipes.

7. The heat dissipation device as claimed in claim 6, wherein the condensing portion of each of the first heat pipes comprises first and second condensing portions interconnected by an additional connecting portion, which construct a U-shaped configuration, and the condensing portion of each of the second heat pipes comprises first and second condensing portions interconnected by an additional connecting portion, which construct a U-shaped configuration.

8. The heat dissipation device as claimed in claim 7, wherein a distance between the first and second condensing portions of each of the second heat pipes is larger than a distance between the first and second condensing portions of each of the first heat pipes.

9. The heat dissipation device as claimed in claim 8, wherein the condensing portions of the second heat pipes are equidistantly located on a top of the second fin group, and the first and second condensing portions of one of the first heat pipes are positioned close to the second and first condensing portions of the other one of the first heat pipes, respectively.

10. The heat dissipation device as claimed in claim 7, wherein the connecting portions of the pair of the first heat pipes are located at two opposite sides of the fin group, and the connecting portions of the pair of the second heat pipes are located at the two opposite sides of the fin group.

11. A heat dissipation device, comprising:
    a base;
    a first fin group, a second fin group mounted on the first fin group, and a third fin group mounted on the second fin group;
    a pair of first heat pipes comprising two first sections sandwiched between the base and the first fin group, two second sections sandwiched between the first and second fin groups, and two third sections interconnecting the first and second sections and located at two opposite sides of the first fin group; and
    a pair of second heat pipes comprising first portions sandwiched between the base and the first fin group, second portions sandwiched between the second and third fin groups, and third portions interconnecting the first and second portions of the second heat pipes and located at the two opposite sides of the first fin group and two opposite sides of the second fin group.

12. The heat dissipation device as claimed in claim 11, wherein the first sections of the first and second heat pipes are straight and parallel to each other.

13. The heat dissipation device as claimed in claim 11, wherein the second sections of the first heat pipes are U-shaped, openings of the second sections are opposite to each other, and a portion of one of the second sections of one of the first heat pipes is inserted into the opening of the other first heat pipe.

14. The heat dissipation device as claimed in claim 11, wherein the second portions of the second heat pipes are U-shaped, openings of the second portions are opposite to each other, and a portion of one of the second portions of one of the second heat pipes is inserted into the opening of the other second heat pipe.

15. A heat dissipation device for dissipating heat generated by an electronic component, the heat dissipation device comprising:
 a base having a bottom surface for contacting the electronic component;
 a first fin group mounted on the base;
 a second fin group mounted on the first fin group;
 a third fin group mounted on the second fin group;
 a pair of first heat pipes each having an evaporating portion thermally connecting with the first fin group and parallel first and second condensing portions received between the first and second fin groups, wherein the second condensing portion of one of the pair of first heat pipes is located between the first and second condensing portions of the other one of the pair of first heat pipes; and
 a pair of second heat pipes each have an evaporating portion thermally connecting with the first fin group and parallel first and second condensing portions received between the second and third fin groups, wherein the second condensing portion of one of the pair of second heat pipes is located between the first and second condensing portions of the other one of the pair of second heat pipes.

16. The heat dissipation device as claimed in claim 15, wherein each of the first heat pipes has a connecting portion interconnecting the evaporating portion and first condensing portion thereof, the connecting portions of the first heat pipes being located at opposite sides of the first fin group, respectively.

17. The heat dissipation device as claimed in claim 16, wherein each of the second heat pipes has a connecting portion interconnecting the evaporating portion and first condensing portion thereof, the connecting portions of the second heat pipes being located at the opposite sides of the first fin group and opposite sides of the second fin group, respectively.

* * * * *